United States Patent [19]

Davis

[11] Patent Number: 4,603,268

[45] Date of Patent: Jul. 29, 1986

[54] TOTEM POLE OUTPUT CIRCUIT WITH REDUCED CURRENT SPIKES

[75] Inventor: Walter R. Davis, Sunnyvale, Calif.

[73] Assignee: National Semiconductor Corporation, Santa Clara, Calif.

[21] Appl. No.: 561,405

[22] Filed: Dec. 14, 1983

[51] Int. Cl.[4] .......................... H03K 5/08; H03K 5/12
[52] U.S. Cl. ..................................... 307/559; 307/456; 307/542; 307/551; 307/565; 307/270; 307/315
[58] Field of Search ............... 307/445, 454, 456, 457, 307/542, 547, 544, 559, 546, 560, 551, 549, 561, 555, 565, 563, 299 B, 317 R, 315, 270

[56] References Cited

U.S. PATENT DOCUMENTS 4,228,371 10/1980 Mazgy ........................... 307/317 A
4,467,226 8/1984 Nagasawa .......................... 307/315

Primary Examiner—Stanley D. Miller
Assistant Examiner—Richard Roseen
Attorney, Agent, or Firm—Gail W. Woodward; Paul J. Winters

[57] ABSTRACT

A totem pole output stage is shown where current spikes are minimized. The circuit disclosed employs four transistors and three diodes to eliminate the spikes associated with the input low to high transition. A fourth diode minimizes the input high to low transition time.

3 Claims, 3 Drawing Figures

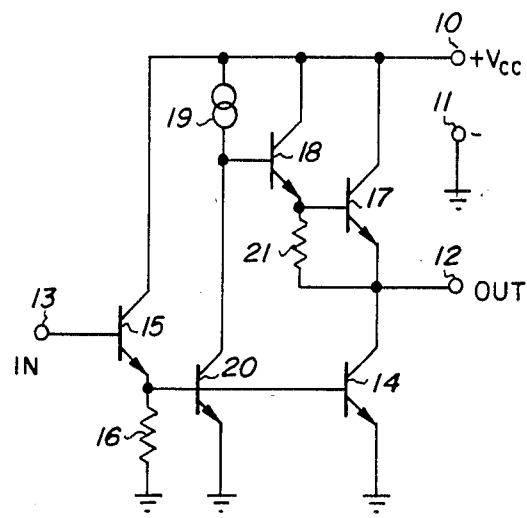
*Fig_1* (PRIOR ART)
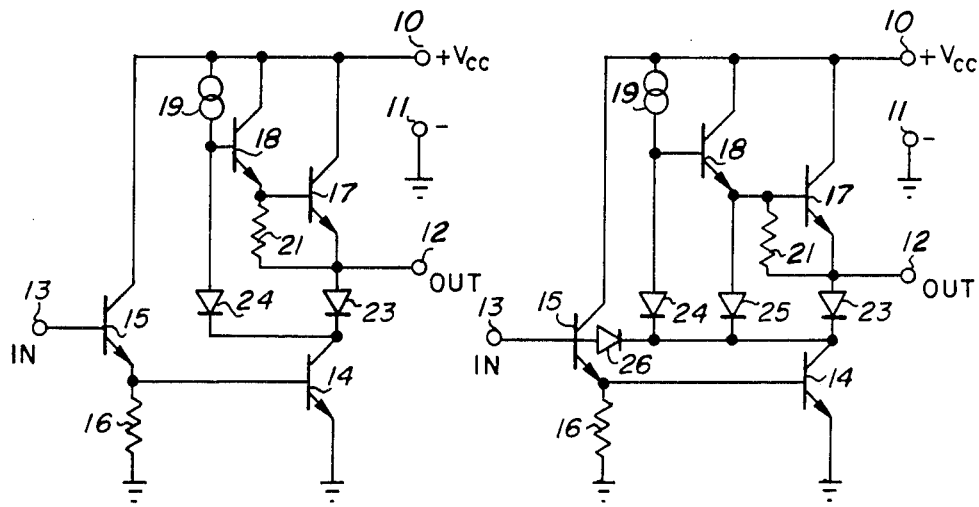
*Fig_2* (PRIOR ART)
*Fig_3*

TOTEM POLE OUTPUT CIRCUIT WITH REDUCED CURRENT SPIKES

BACKGROUND OF THE INVENTION

Totem pole transistor output stages are used to drive loads wherein the stage can either source or sink output current. Such stages typically will briefly source and sink current simultaneously so that a current spike, or pulse, will occur. The spike will become appreciable at the high operating frequencies. Since such a spike produces no useful output, it is parasitic and only results in wasted power. When excessive, the resulting heating can be deleterious to the integrated circuit (IC) that employs the stage.

SUMMARY OF THE INVENTION

It is an object of the invention to provide a totem pole output stage in which current spikes are minimized.

It is a further object of the invention to provide a totem pole circuit in which the current sourcing action is terminated by the current sinking action whereby the two actions do not occur simultaneously.

These and other objects are achieved as follows. The output stage employs a Darlington connected transistor pair with a current source input to act as a current source to an output terminal. A current sink transistor connected to the output terminal provides the sink capability. The current sink transistor has a diode coupled in series with its collector poled to conduct the sink current. A second diode is coupled from the base of the Darlington output transistor to the current sink transistor collector. A third diode is coupled from the base of the Darlington driver transistor to the current sink transistor collector. Since all three diodes are driven in common from the collector of the sink transistor, they can act as switching elements to control the current sourcing action of the Darlington pair. Since the three diodes cannot conduct simultaneously, the Darlington pair cannot conduct while the current sink transistor is conducting and current spikes are avoided.

If desired a fourth diode can be coupled between the current sink collector and the input of a source follower driver to soften the saturation characteristic of the current sink transistor.

BRIEF DESCRIPTION OF THE DRAWING

FIGS. 1 and 2 are a schematic diagrams of a prior art totem pole output stages.

FIG. 3 is a schematic diagram of the circuit of the invention.

DESCRIPTION OF THE PRIOR ART

In FIG. 1 the circuit operates from a $V_{CC}$ power supply connected + to terminal 10 and − to ground terminal 11. Output terminal 12 provides an inverted response to the signal applied at input terminal 13. When turned on, transistor 14 sinks current from terminal 12 to ground. Emitter follower transistor 15 drives the base of transistor 14. The threshold of conduction for transistor 14 is 2 $V_{BE}$ at terminal 13. When terminal 13 is low (below the threshold) resistor 16 pulls the base of transistor 14 low and turns it off.

Transistors 17 and 18 are Darlington connected to source current to terminal 12. When terminal 13 is low and transistor 14 turned off, current source 19 will pass current into the base of transistor 18 so the Darlington pair will source current to terminal 12 and pull it high.

When terminal 13 is high (above threshold), and transistor 14 turned on to act as a current sink, transistor 20 will also be turned on so as to pull the base of transistor 18 low thereby turning the Darlington pair off. In effect transistor 20 will divert the current from source 19 away from the base of transistor 18. When transistor 18 is off, resistor 28 will pull the base of transistor 17 toward its emitter thereby turning it off.

This circuit has the problem that when terminal 13 is low, transistor 17 can saturate. Then when terminal 13 goes high and transistor 20 pulls the base of transistor 18 low, there will be a turn off delay in transistor 17 due to minority carrier storage. Since the transition from low to high will turn transistor 14 on there will be a conduction path through transistors 14 and 17 that will result in a current spike. This spike will last until transistor 17 actually turns off. At this point transistor 14 will sink current from terminal 12 normally. Such a current spike is purely parasitic and will only produce heat which can be a problem for an associated IC chip. FIG. 2 is another prior art output stage circuit. Where the various elements operate in the same way as FIG. 1 the same numbers are employed. The main difference is the inclusion of diodes 23 and 24 and the omission of transistor 20. When transistor 14 is off no current will flow in either diode 23 or 24. Thus the current in source 19 will flow into the base of transistor 18 thereby turning it and transistor 17 on. In this state the circuit will source current to terminal 12 and act as a pull up device. It can be seen that, in this state, diode 23 will be reverse biased and, while diode 24 will be slightly forward biased, it is at zero current. When the signal drive turns transistor 14 on diode 23 will also be turned on so that the circuit will sink current from terminal 12 and act as a pull down device. At the same time diode 24 will conduct and steal base current from transistor 18 thereby turning it off. While the cessation of current in transistor 18 will act to turn transistor 17 off there will be a delay due to its stored charge. This creates a transient conductive path, and a current spike, from terminal 10 to ground during the stored charge removal time. Therefore the circuit of FIG. 2 suffers from the same drawback as that of FIG. 1.

DESCRIPTION OF THE INVENTION

FIG. 3 is a schematic diagram of the circuit of the invention. Where the parts are the same as those of FIGS. 1 and 2, the same numbers are used and they function in substantially the same way. It can be seen that transistor 20 has been eliminated and two diodes 25 and 26 added to the FIG. 2 circuit. The collector of transistor of 14 serves as the common cathode connection for diodes 23–26. Diode 23 is connected between output terminal 12 and the collector of transistor 14 while diodes 24–26 have their anodes connected to the bases of transistors 18, 17 and 15 respectively.

Diode 23 and transistor 17 cannot both conduct simultaneously because of the presence of diode 25. For both diode 23 and transistor 17 to be conductive the anode of diode 25 will have to be 2 $V_{BE}$ above its cathode. Since not more than one $V_{BE}$ drop can exist here, simultaneous conduction is precluded. Because of the presence of diode 24, the same is true of transistor 18 and diode 25 they cannot conduct simultaneously.

For terminal 12 to source output current, transistors 18 and 17 are conductive in response to current source 19. In this state diodes 23-25 are all non conductive. When transistor 14 becomes conductive its collector is pulled down thereby turning diodes 23-25 on. Diode 24 steals base current away from transistor 18, diode 25 steals base current away from transistor 17, and diode 23 becomes conductive so that transistor 14 can sink current from output terminal 12.

The turn on of all three diodes is a transient condition where they steal base current from transistors 17 and 18 when transistor 14 is turned on. This action will quickly discharge the circuit nodes presented by the bases of transistors 17 and 18 and any stored charge is very rapidly eliminated. Once the switching has been accomplished, diode 23 will conduct the sink current in transistor 14 and the current from source 19 will forward bias diode 24.

Since diode 23 and transistor 17 cannot conduct simultaneously, as explained above, there can be no current spike. Thus, there is no simultaneous conduction in transistors 14 and 17.

Diode 26 is present to soften the saturation characteristic of transistor 14. If the input at terminal 13 tries to force transistor 14 into saturation (via transistor 15), when the collector of transistor 14 drops below $V_{BE}$, diode 26 will start to conduct. This will pull the base of transistor 15 down and in effect clamp input terminal 13 to about 2 $V_{BE}$ above ground. Since this will avoid saturation in transistor 14 the circuit does not have a saturation problem in the input high to low transition.

Another problem associated with the prior art circuit of FIG. 1 is called zenering. For example assume that a fairly large capacitive load is being driven at terminal 12. Once this capacitor is charged to a substantial voltage it will tend to stay high even when the output is switched low. With terminal 12 held high and with transistor 20 turned on the base-emitter junctions of transistors 17 and 18 will be reverse biased. In some cases this bias can exceed the zener level and reverse bias conduction occurs. In the circuit of FIG. 3 this cannot happen.

The circuit of the invention has been shown and its operation described. When a person skilled in the art reads the above description, alternatives and equivalents, within the spirit and intent of the invention, will become apparent. Accordingly it is intended that the scope of the invention be limited only by the following claims.

I claim:

1. A totem pole transistor output stage circuit capable of sourcing and sinking output current in a load, said circuit having signal input and output terminals and comprising:
   first and second power supply terminals connectable to a source of operating power;
   a first output transistor having its emitter coupled to said output terminal, its collector coupled to said first power supply terminal, and a base;
   a first driver transistor coupled in Darlington configuration to drive said first output transistor and having a base;
   a second output transistor having its collector coupled to said output terminal, its emitter coupled to said second power supply terminal, and a base coupled to said input terminal;
   a first diode coupled in series between said collector of said second output transistor and said output terminal and poled in a same direction as the base-emitter junction of the second output transistor;
   a second diode coupled between said collector of said second output transistor and said base of said first output transistor and poled in a same direction as the base-emitter junction of the second output transistor;
   a third diode coupled between said collector of said second output transistor and said base of said first driver transistor and poled in a same direction as the base-emitter junction of the second output transistor; and
   a constant current device coupled between said first power supply terminal and said base of said first driver transistor.

2. The circuit of claim 1 wherein said base of said second output transistor is driven from an emitter follower transistor having its base coupled to said signal input terminal.

3. The circuit of claim 2 further including a fourth diode coupled between said collector of said second output transistor and said base of said emitter follower transistor and poled to be conductive when said second output transistor is conductive.

* * * * *